(12) United States Patent
Bentley et al.

(10) Patent No.: US 9,577,042 B1
(45) Date of Patent: Feb. 21, 2017

(54) SEMICONDUCTOR STRUCTURE WITH MULTILAYER III-V HETEROSTRUCTURES

(71) Applicant: GLOBALFOUNDRIES Inc., Grand Caymay (KY)

(72) Inventors: Steven Bentley, Watervliet, NY (US); Rohit Galatage, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/825,949

(22) Filed: Aug. 13, 2015

(51) Int. Cl.
| | | |
|---|---|---|
| H01L 29/205 | (2006.01) | |
| H01L 29/165 | (2006.01) | |
| H01L 29/10 | (2006.01) | |
| H01L 29/78 | (2006.01) | |
| H01L 29/66 | (2006.01) | |

(52) U.S. Cl.
CPC ......... *H01L 29/1054* (2013.01); *H01L 29/165* (2013.01); *H01L 29/205* (2013.01); *H01L 29/66462* (2013.01); *H01L 29/785* (2013.01)

(58) Field of Classification Search
CPC ...... H01L 29/152; H01L 29/15; H01L 29/205; H01L 29/778; H01L 29/20
USPC .................... 257/192, 22, 191; 438/303, 172
See application file for complete search history.

(56) References Cited

U.S. PATENT DOCUMENTS

| | | | | |
|---|---|---|---|---|
| 6,287,891 | B1* | 9/2001 | Sayyah | 438/106 |
| 6,683,334 | B2* | 1/2004 | Barkhordarian | 257/199 |
| 2008/0142844 | A1* | 6/2008 | Aulnette et al. | 257/191 |
| 2008/0272396 | A1* | 11/2008 | Fournel et al. | 257/190 |
| 2010/0093141 | A1* | 4/2010 | Jung et al. | 438/239 |
| 2012/0168877 | A1 | 7/2012 | Mukherjee et al. | |
| 2014/0353587 | A1* | 12/2014 | Hoteida et al. | 257/22 |

OTHER PUBLICATIONS

Lin, et al., "Novel Intrinsic and Extrinsic Engineering for High-Performance High-Density Self-Aligned InGaAs MOSFETs: Precise Channel Thickness Control and Sub-40-nm Metal Contacts," IEEE, 2014, pp. 25.1.1-251.4.

* cited by examiner

*Primary Examiner* — Sheng Zhu
(74) *Attorney, Agent, or Firm* — Wayne F. Reinke, Esq.; Heslin Rothenberg Farley & Mesiti P.C.

(57) ABSTRACT

The source/drain of a fully III-V semiconductor or Si-based transistor includes a bottom barrier layer that may be lattice matched to the channel, a lower layer of a wide bandgap III-V material and a top layer of a comparatively narrow bandgap III-V material, with a compositionally graded layer between the lower layer and top layer gradually transitioning from the wide bandgap material to the narrow bandgap material.

9 Claims, 3 Drawing Sheets

SEMICONDUCTOR STRUCTURE WITH MULTILAYER III-V HETEROSTRUCTURES

BACKGROUND OF THE INVENTION

Technical Field

The present invention generally relates to the use of semiconductor materials in devices from Groups III and V of the Periodic Table of Elements. More particularly, the present invention relates to the use of a III-V material heterostructure in the source/drain regions using a wide bandgap III-V layer combined or graded upwardly to another III-V material with a comparatively small bandgap.

Background Information

The effective current through the channel of a transistor faces several bottlenecks as semiconductor devices continue shrinking. One of the most critical bottlenecks is extrinsic resistance, whereby the access regions of the device outside the channel dramatically reduce drive current. To maximize drive current, transistors require both low resistance source/drain regions and low contact resistance. Although the use of low effective mass semiconductor materials, (including III-V materials such as $In(x)Ga(1-x)As$, or silicon germanium alloys) for the channel may reduce channel resistance by introducing low carrier effective mass, these materials are prone to damaging off-state leakage and undesirable hot carrier effects such as impact ionization. The source of these effects lies in phenomena such as band-to-band tunneling, resulting from bandgaps that are generally smaller than silicon, and high electric field density, which is dependent on device geometry. In addition, achieving contact resistance requirements for scaled devices has proved to be extremely challenging, but an increasingly important contributor to the performance of the final device. Moving to materials with the smallest effective masses (e.g., InAs, Ge) improves both contact resistance and enhances mobility, but this comes at the expense of increased off-state leakage.

A need therefore continues to exist for a way to achieve both low source/drain resistance and low contact resistance, without incurring unwanted channel leakage.

SUMMARY OF THE INVENTION

The shortcomings of the prior art are overcome and additional advantages are provided through the provision, in one aspect, of a method. The method includes, as part of a gate first or replacement gate fabrication process, providing a starting semiconductor structure, the starting structure including a semiconductor substrate, an active region including a source region, a drain region and a channel region therebetween, and a gate structure above the channel region. The method further includes, in each of the source and drain regions, forming a bottom barrier layer of a first compound semiconductor material, and forming a seed layer of a second compound semiconductor material over the bottom barrier layer, the seed layer having a first bandgap. The method further includes forming a top layer of a third compound semiconductor material above the seed layer, the top layer having a second bandgap that is narrow compared to the first bandgap, and forming a compositionally graded layer of the second and third compound semiconductor materials between the seed layer and the top layer, the compositionally graded layer gradually transitioning from the second compound semiconductor material at a bottom portion thereof to the third compound semiconductor material at a top portion thereof. Each compound semiconductor material includes at least one semiconductor material from each of Groups III and V of the Periodic Table of Elements.

In accordance with another aspect, the present invention provides a transistor. The transistor includes a channel region, and a source region and a drain region oppositely adjacent the channel region. Each of the source region and the drain region includes a bottom barrier layer of a first compound semiconductor material, a seed layer of a second compound semiconductor material over the bottom barrier layer having a first bandgap, a top layer above the seed layer of a third compound semiconductor material having a second bandgap, the second bandgap being narrow in comparison to the first bandgap, each compound semiconductor material including at least one semiconductor material from each of Groups III and V of the Periodic Table of Elements, and a compositionally graded layer between the seed layer and the top layer, the compositionally graded layer gradually transitioning from the second compound semiconductor material to the third compound semiconductor material.

These, and other objects, features and advantages of this invention will become apparent from the following detailed description of the various aspects of the invention taken in conjunction with the accompanying drawings.

DETAILED DESCRIPTION OF THE INVENTION

Figure 1:
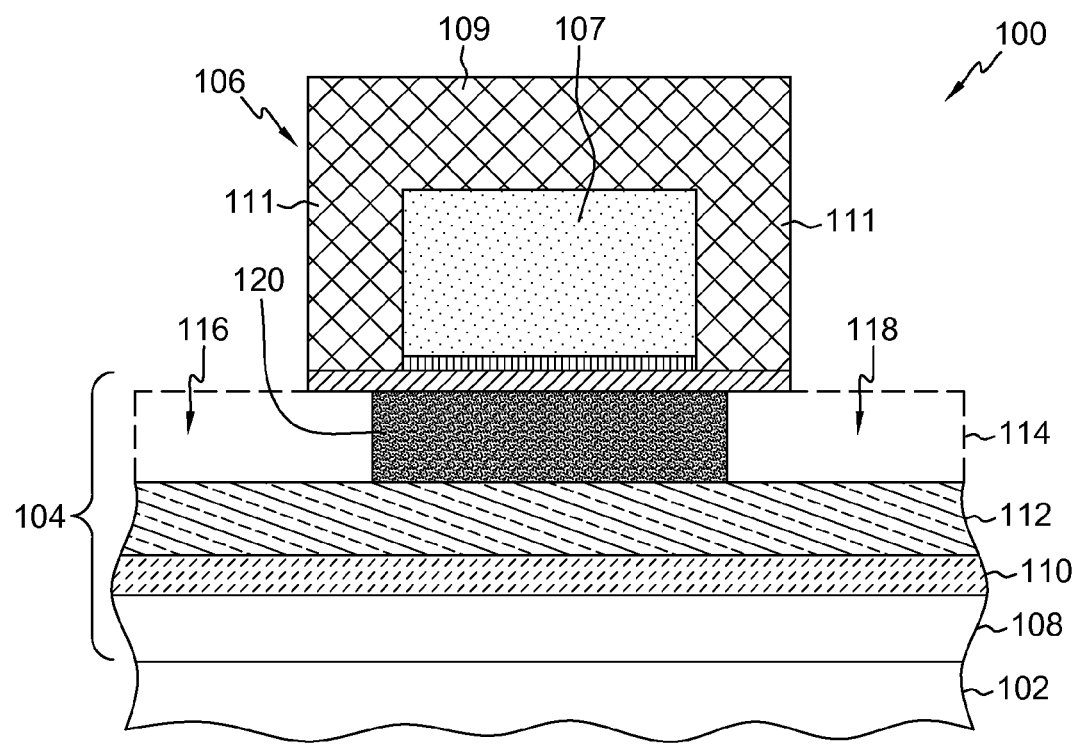
FIG. 1 is a cross-sectional view of one example of a three-dimensional starting semiconductor structure, the starting structure including a substrate and a fin coupled to the substrate, and a dummy gate structure over the fin, the fin including a first layer of a same semiconductor material as the substrate, a buffer layer over the first layer, a barrier layer of a first semiconductor material, an active layer having thereacross a source region, a drain region and a channel region between the source and drain regions, at least one of the source and drain may include a compound semiconductor material of at least one element from each of Groups III and V of the Periodic Table of Elements, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

The solution of the present invention to address the need for both low source/drain resistance and low source/drain contact resistance while avoiding unwanted channel leakage, is the use of multilayer III-V heterostructures for the source/drain regions, either as part of a fully III-V device or just in the source/drain regions of a silicon-based device. Further, although the examples show three-dimensional semiconductor structures, it will be understood that the present invention can be used with planar devices as well.

FIG. 1 is a cross-sectional view of one example of a three-dimensional starting semiconductor structure 100, the starting structure including a substrate 102 and at least one fin 104 coupled to the substrate, and a dummy gate structure 106 over the fin(s), the dummy gate structure including, for example, a dummy gate material 107 (e.g., polysilicon) and a cap 109 with spacers 111 (e.g., a hard mask material such as silicon nitride), each fin including an optional first layer 108 of a semiconductor material, a buffer layer 110 over the first layer, a barrier layer 112, an active layer 114 having thereacross a source region 116, a drain region 118 and a channel region 120 between the source and drain regions. Layers 108, 110 and 112 may each include, for example, silicon, a compound semiconductor such as silicon germanium, or a III-V compound semiconductor, including at least one element from each of Groups III and V of the Periodic Table of Elements. Alternatively, any or all of layers 108, 110 and 112 may be a dielectric layer, such as, for example, silicon dioxide. The active region 114 includes at least partially one or more compound semiconductor materials including at least one element from each of Groups III and V of the Periodic Table of Elements, in accordance with one or more aspects of the present invention.

In one example, where the channel is silicon-based, the buffer and barrier layers may be, for example, silicon, silicon germanium, an oxide layer, or may be differentiated by different doping regions.

In another example, where the channel includes a III-V material (e.g., indium gallium arsenide), the buffer layer may include, for example, gallium arsenide, indium phosphide, indium gallium arsenide or indium aluminum arsenide, while the barrier layer may include, for example, indium phosphide or indium aluminum arsenide.

The starting structure may be conventionally fabricated, for example, using known processes and techniques. Further, unless otherwise noted, conventional processes and techniques may be used to achieve individual steps of the fabrication process of the present invention. However, although only a single transistor is shown for simplicity, it will be understood that, in practice, many such structures are typically included on the same bulk substrate.

In one example, substrate 102 may include any material suitable for semiconductor devices or any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium (SiGe)

substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof an alloy of semiconductor materials including GaAsP, AlInAs, GaInAs, GaInP, GaInAsP, AlAsSb, or combinations thereof.

The present invention can be applied to a planar or non-planar semiconductor structure. In one example, a non-planar structure may be used, which further includes at least one "fin" or raised semiconductor structure 104 (raised with respect to the substrate). The raised structure(s) may, for example, be etched from a bulk substrate, and may include, for example, any of the materials listed above with respect to the substrate. Further, some or all of the raised structure(s) may include added impurities (e.g., by doping), making them n-type or p-type. The structure further includes at least one gate structure over the channel region, in this example, gate structure 106 surrounds a portion of one or more of the raised structures.

Figure 2:
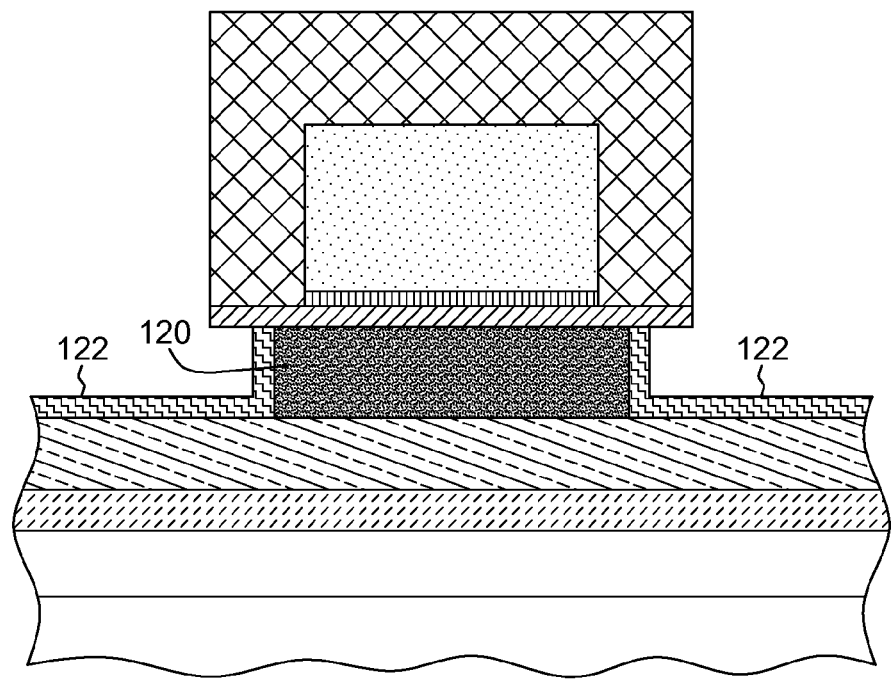
FIG. 2 depicts one example of the starting structure of FIG. 1 after forming a bottom barrier layer in each of the source region and the drain region that has a wide bandgap in comparison to a subsequent layer, described below, in accordance with one or more aspects of the present invention.

FIG. 2 depicts one example of the starting structure of FIG. 1 after forming a second barrier layer 122 of a compound semiconductor material in each of the source region (116, FIG. 1) and the drain region (118, FIG. 1) that is preferably lattice matched to the channel region 120, in accordance with one or more aspects of the present invention. As used herein, a "compound semiconductor material" includes one or more semiconductor materials from each of Groups III and V of the Periodic Table of Elements.

In one example, the second barrier layer 122 includes a semiconductor material having a comparatively wide bandgap, and may be lattice matched to the channel region. The material of the bottom barrier layer may include, for example, indium phosphide, which has a bandgap of about 1.34 eV, or indium aluminum arsenide, which has a bandgap of about 1.5 eV, and may be formed, for example, using one or more conventional fabrication methods and processes.

Figure 3:
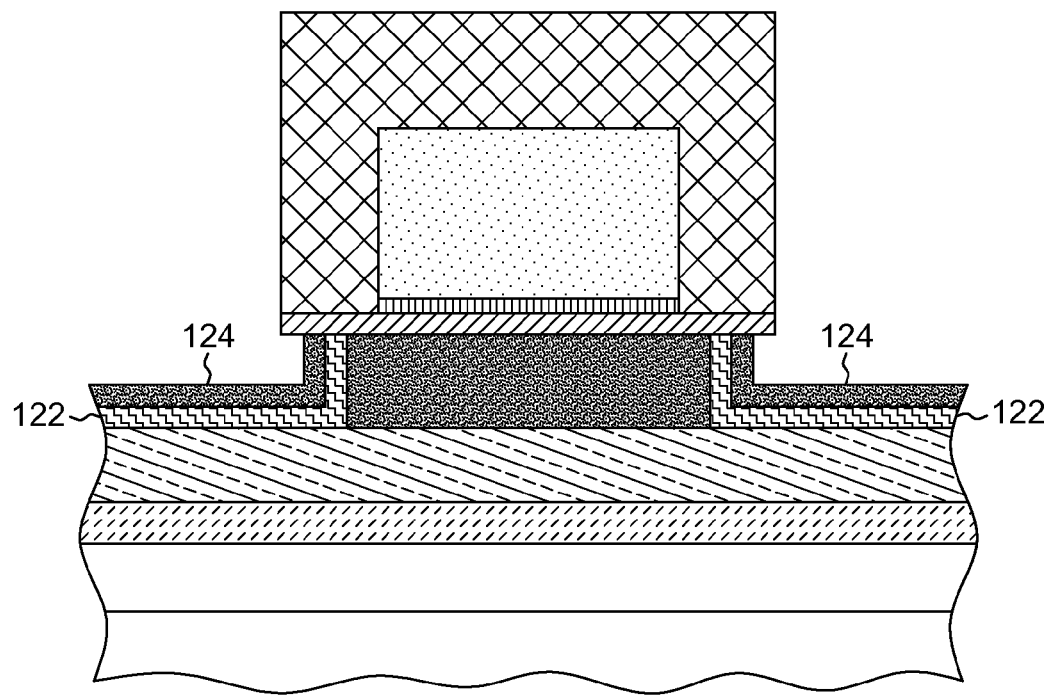
FIG. 3 depicts one example of the semiconductor structure of FIG. 2 after forming a seed layer in each of the source and drain regions over the bottom barrier layer, in accordance with one or more aspects of the present invention.

FIG. 3 depicts one example of the semiconductor structure of FIG. 2 after forming a seed layer 124 of a compound semiconductor material in each of the source and drain regions over the second barrier layer 122, in accordance with one or more aspects of the present invention.

The seed layer 124 is preferably lattice matched to the second barrier layer 122, may be doped to the same polarity as the channel and may be formed, for example, using one or more conventional fabrication processes and techniques. In one example, the seed layer material includes indium gallium arsenide, and is formed by epitaxial growth on the barrier layer. In another example, the seed layer is doped.

Figure 4:
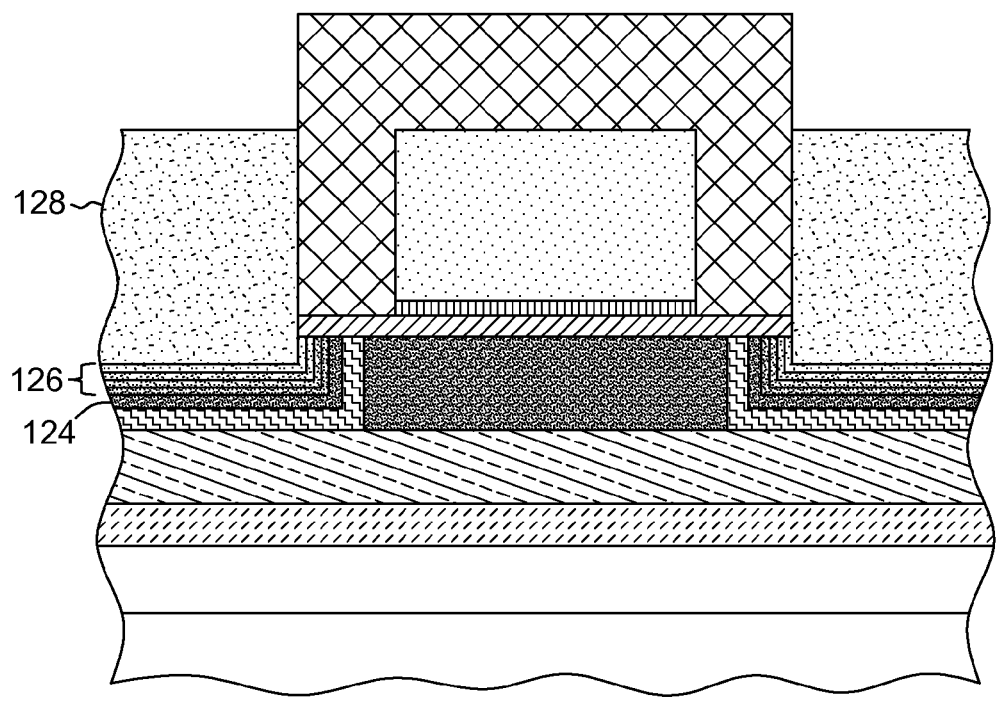
FIG. 4 depicts one example of the semiconductor structure of FIG. 3 after forming a compositionally graded layer over the seed layer and forming a top layer over the compositionally graded layer, the compositionally graded layer gradually transitioning from the material of the seed layer to the material of the top layer, the top layer having a narrow bandgap compared to a bandgap of the seed layer, in accordance with one or more aspects of the present invention.

FIG. 4 depicts one example of the semiconductor structure of FIG. 3 after forming a compositionally graded layer 126 over the seed layer 124 and forming a top layer 128 over the compositionally graded layer, the compositionally graded layer gradually transitioning upward from the material of the seed layer to the material of the top layer, the top layer having a narrow bandgap compared to a bandgap of the seed layer, in accordance with one or more aspects of the present invention. The graded layer may have any number of constituent layers for the gradual transition. However, in many situations, a greater number of layers is preferred. Further, although the present example includes a seed layer and a top layer for ease of understanding, it will be understood that the compositionally graded layer may effectively be the seed layer, top layer and compositionally graded layer.

The compositionally graded layer 126 includes multiple layers gradually transitioning from the compound semiconductor material of the seed layer 124 to the compound semiconductor material of the top layer 128, and may be formed using one or more conventional fabrication processes and techniques. In one example, the bandgap transition spans a range of about 0.36 eV (indium arsenide) to about 1.42 eV (gallium arsenide). In another example, the compound material of the seed layer includes indium gallium arsenide (InGaAs), the compound material of the top layer includes indium arsenide (InAs) with a bandgap of about 0.36 eV, and the compositionally graded layer transitions from all InGaAs to all InAs with a gradual mixture of the two there between. In another example, the seed layer may include indium phosphide (InP), with the compositionally graded layer starting with 53% indium gallium arsenide (InGaAs), and gradually increasing, in the direction toward the top layer, the percentage of indium in InGaAs to 100% (indium arsenide (InAs)).

Figure 5:
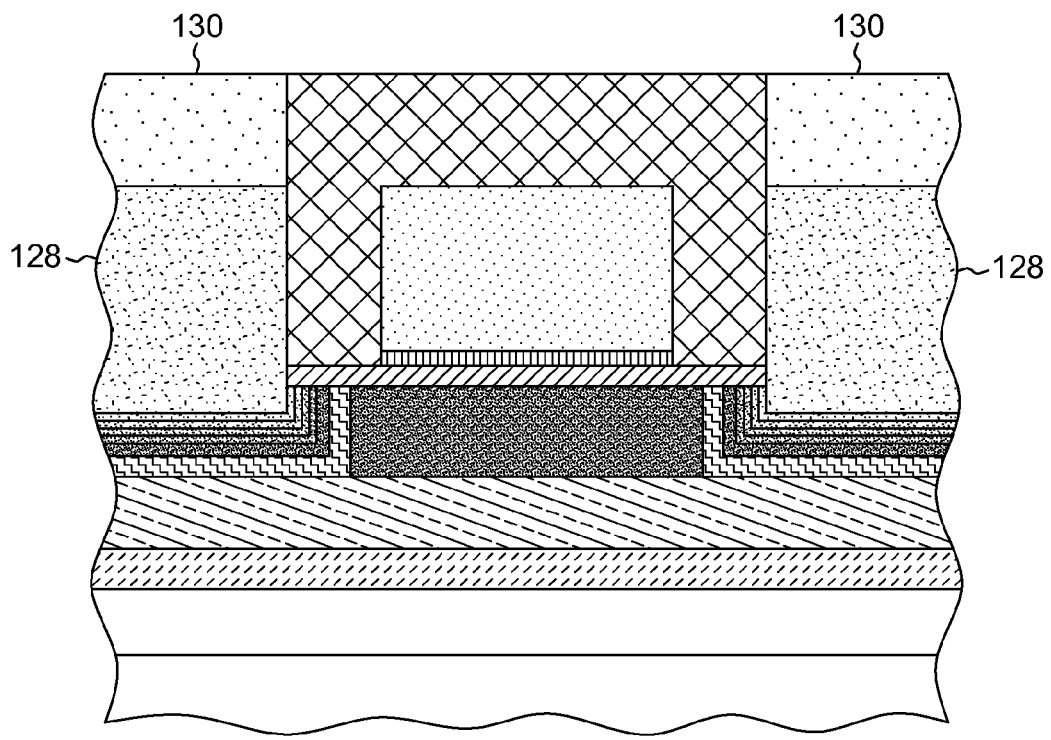
FIG. 5 depicts one example of the semiconductor structure of FIG. 4 after forming a dielectric layer in each of the source and drain regions over the top layer of the narrow bandgap material and planarizing the dielectric layer, in accordance with one or more aspects of the present invention.

FIG. 5 depicts one example of the semiconductor structure of FIG. 4 after forming a dielectric layer 130 (e.g., an interlayer dielectric material) using, for example, one or more conventional processes and techniques, in each of the source and drain regions over the top layer 128 of the narrow bandgap material, in accordance with one or more aspects of the present invention.

Figure 6:
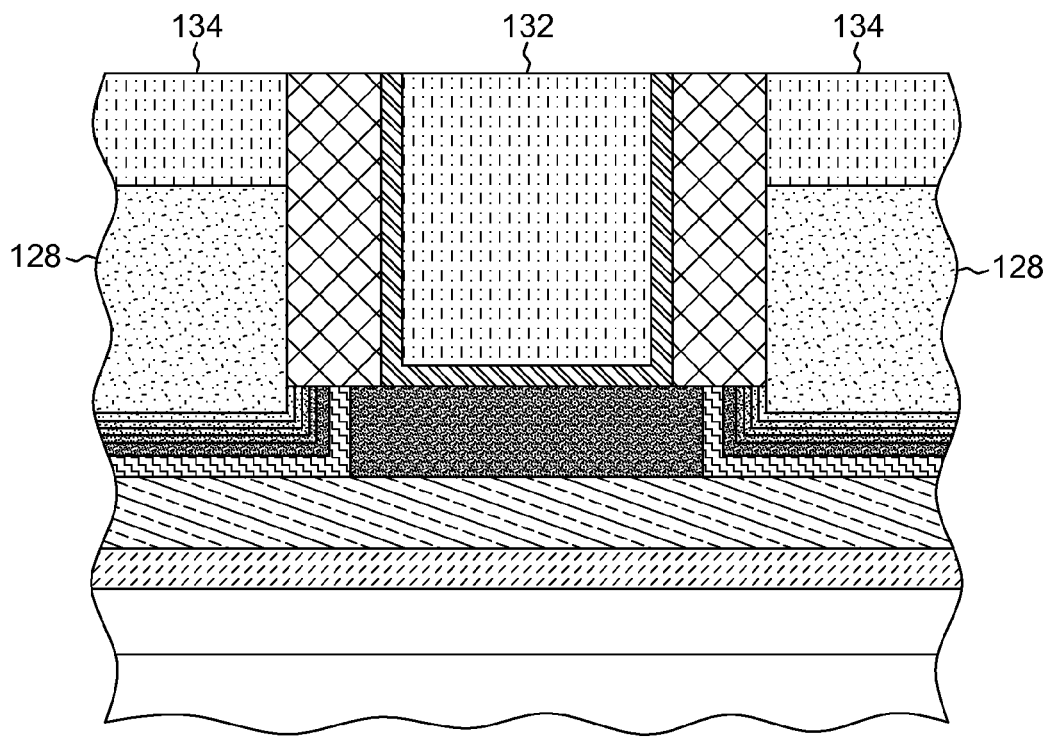
FIG. 6 depicts one example of the semiconductor structure of FIG. 5 after replacing the dummy gate with a gate dielectric and metal gate and forming a contact in each of the source and drain regions over the top layer of narrow bandgap material, in accordance with one or more aspects of the present invention.

FIG. 6 depicts one example of the semiconductor structure of FIG. 5 after replacing the dummy gate with a metal gate 132 and forming a contact 134 in each of the source and drain regions over the top layer 128 of narrow bandgap material, in accordance with one or more aspects of the present invention.

In a first aspect, disclosed above is a method. The method includes providing a starting semiconductor structure, the starting structure including a semiconductor substrate, an active region including a source region, a drain region and a channel region therebetween, and a gate structure above the channel region. The method further includes, in each of the source and drain regions, forming a bottom barrier layer of a first compound semiconductor material, and forming a seed layer of a second compound semiconductor material over the bottom barrier layer, the seed layer having a first bandgap. The method further includes forming a top layer of a third compound semiconductor material above the seed layer, the top layer having a second bandgap that is narrow compared to the first bandgap, and each compound semiconductor material includes semiconductor material(s) from each of Groups III and V of the Periodic Table of Elements. The method further includes forming a compositionally graded layer of the second and third compound semiconductor materials between the seed layer and the top layer, the compositionally graded layer gradually transitioning from the second compound semiconductor material at a bottom portion thereof to the third compound semiconductor material at a top portion thereof.

In one example, the bottom barrier layer has a bandgap that is, for example, wide in comparison to that of the top layer.

In one example, the channel region in the starting semiconductor structure in the method of the first aspect may include, for example, a fourth semiconductor material of semiconductor material(s) from Group IV or from each of Groups III and V of the Periodic Table of Elements. In one example, the fourth semiconductor material may include, for example, one of silicon, indium gallium arsenide and silicon germanium.

In one example, the first compound semiconductor material in each of the source and drain regions in the starting semiconductor structure in the method of the first aspect may be, for example, lattice matched to the channel region.

In one example, the starting semiconductor structure in the method of the first aspect may further include, for example, fin(s) coupled to the substrate, and the active region may be located at a top portion of the fin(s).

In one example, the first compound semiconductor material of the bottom barrier layer of the starting semiconductor structure in the method of the first aspect may include, for example, indium phosphide.

In one example, the second compound semiconductor material of the seed layer of the starting semiconductor structure in the method of the first aspect may include, for example, indium gallium arsenide that is lattice matched to the bottom barrier layer.

In one example, the third compound semiconductor material of the top layer of the starting semiconductor structure in the method of the first aspect may include, for example, indium arsenide, and the second compound semiconductor material of the seed layer may include, for example, indium gallium arsenide.

In a second aspect, disclosed above is a transistor. The transistor includes a channel region, and a source region and a drain region oppositely adjacent the channel region, each of the source region and the drain region including a bottom barrier layer of a first compound semiconductor material, a seed layer of a second compound semiconductor material over the bottom barrier layer having a first bandgap, a top layer above the seed layer of a third compound semiconductor material having a second bandgap, the second bandgap being narrow in comparison to the first bandgap, each compound semiconductor material including semiconductor material(s) from each of Groups III and V of the Periodic Table of Elements. The transistor further includes a compositionally graded layer between the seed layer and the top layer, the compositionally graded layer gradually transitioning from the second compound semiconductor material to the third compound semiconductor material.

In one example, the first compound semiconductor material of the transistor of the second aspect may be, for example, lattice matched to the channel region.

In one example, the transistor of the second aspect may further include, for example, a substrate and fin(s) coupled to the substrate, the source region, channel region and drain region being situated at a top portion of the fin(s).

In one example, the bottom barrier layer of the transistor of the second aspect may have, for example, a bandgap that is wide in comparison to that of the top layer.

In one example, the channel region of the transistor of the second aspect may include, for example, semiconductor material(s) from Group IV or from each of Groups III and V of the Periodic Table of Elements.

In one example, the channel region of the transistor of the second aspect may include, for example, one of silicon, indium gallium arsenide and silicon germanium.

In one example, the first compound semiconductor material of the bottom barrier layer of the transistor of the second aspect may include, for example, indium phosphide.

In one example, the second compound semiconductor material of the seed layer of the transistor of the second aspect may include, for example, a n-type semiconductor material that is lattice matched to the bottom barrier layer. In one example, the n-type semiconductor material may include, for example, indium gallium arsenide.

In one example, the third compound semiconductor material of the top layer of the transistor of the second aspect may include, for example, indium arsenide. In one example, the second compound semiconductor material of the seed layer may include, for example, indium gallium arsenide.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:
1. A method, comprising:
providing a starting semiconductor structure, the starting structure comprising a semiconductor substrate, an active region comprising a source region, a drain region and a channel region therebetween, and a gate structure above the channel region;
in each of the source and drain regions, forming a bottom barrier layer of a first compound semiconductor material;
forming a seed layer of a second compound semiconductor material over the bottom barrier layer, the seed layer having a first bandgap;
forming a top layer of a third compound semiconductor material above the seed layer, the top layer having a second bandgap that is narrow compared to the first bandgap, wherein each compound semiconductor material comprises at least one semiconductor material from each of Groups III and V of the Periodic Table of Elements; and
forming a compositionally graded layer of the second and third compound semiconductor materials between the seed layer and the top layer, the compositionally graded layer gradually transitioning from the second compound semiconductor material at a bottom portion thereof to the third compound semiconductor material at a top portion thereof.

2. The method of claim 1, wherein the bottom barrier layer has a bandgap that is wide in comparison to that of the top layer.

3. The method of claim 1, wherein the channel region comprises a fourth semiconductor material of at least one semiconductor material from Group IV or from each of Groups III and V of the Periodic Table of Elements.

4. The method of claim 3, wherein the fourth semiconductor material comprises one of silicon, indium gallium arsenide and silicon germanium.

5. The method of claim 1, wherein the first compound semiconductor material is lattice matched to the channel region.

6. The method of claim 1, the starting semiconductor structure further comprising at least one fin coupled to the substrate, and wherein the active region is located at a top portion of the at least one fin.

7. The method of claim 1, wherein the first compound semiconductor material of the bottom barrier layer comprises indium phosphide.

8. The method of claim 1, wherein the second compound semiconductor material of the seed layer comprises indium gallium arsenide that is lattice matched to the bottom barrier layer.

9. The method of claim 1, wherein the third compound semiconductor material of the top layer comprises indium arsenide, and wherein the second compound semiconductor material of the seed layer comprises indium gallium arsenide.

\* \* \* \* \*